United States Patent [19]

Matsuo et al.

[11] Patent Number: 4,511,814
[45] Date of Patent: Apr. 16, 1985

[54] SEMICONDUCTOR ANALOG SWITCH CIRCUIT WITH COMPENSATION MEANS TO MINIMIZE OFFSET OF OUTPUT VOLTAGE

[75] Inventors: Kenji Matsuo, Yokohama; Eiji Masuda, Kawasaki, both of Japan

[73] Assignee: Tokyo Shibaura Denki Kabushiki Kaisha, Japan

[21] Appl. No.: 445,038

[22] Filed: Nov. 29, 1982

[30] Foreign Application Priority Data

Nov. 30, 1981 [JP] Japan ................ 56-192251

[51] Int. Cl.³ .................. H03K 17/16; H03K 17/693; H03K 19/096
[52] U.S. Cl. .................................... 307/572; 307/443; 307/242; 307/577; 307/579; 307/584; 307/585
[58] Field of Search ............... 307/443, 451, 353, 242, 307/247 R, 572, 576, 577, 579, 584, 585, 264

[56] References Cited

U.S. PATENT DOCUMENTS

| | | | |
|---|---|---|---|
| 3,457,435 | 7/1969 | Burns et al. | 307/585 |
| 3,720,848 | 3/1973 | Schmidt, Jr. | 307/579 |
| 4,075,509 | 2/1978 | Redfern | 307/251 |
| 4,080,539 | 3/1978 | Stewart | 307/264 |
| 4,096,401 | 6/1978 | Hollingsworth | 365/184 X |
| 4,181,862 | 1/1980 | Dingwall | 307/200 B X |
| 4,251,739 | 2/1981 | Morozumi | 307/585 X |
| 4,393,318 | 7/1983 | Takahashi et al. | 307/577 X |

FOREIGN PATENT DOCUMENTS 55-64437 5/1980 Japan.

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

A semiconductor analog switch circuit device is disclosed in which a second analog switch circuit is connected in parallel with a first analog switch circuit. The first and second switch circuits are controlled by control pulses with opposite phases. An input signal is applied to one of the parallel junctions of the first and second analog switch circuits, while an output signal is derived from the other parallel junction.

4 Claims, 24 Drawing Figures

F I G. 7A
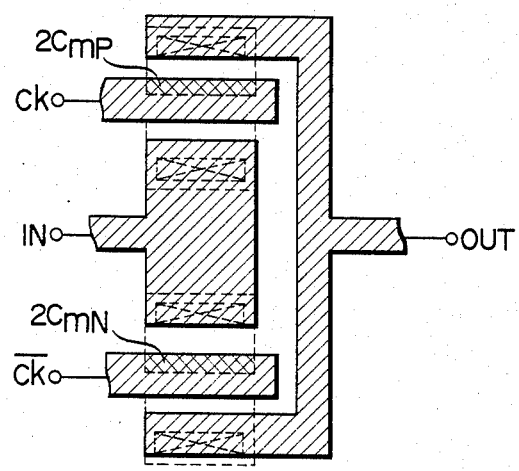
F I G. 7B
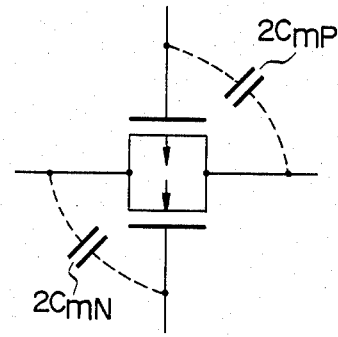
F I G. 8A
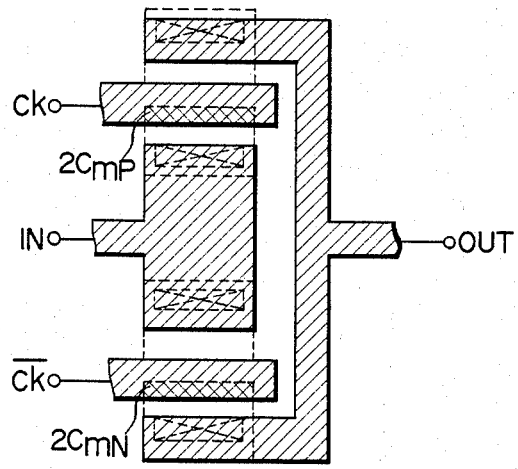
F I G. 8B
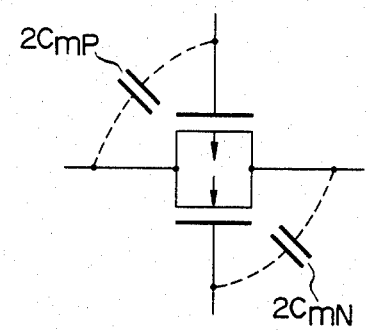

F I G. 12
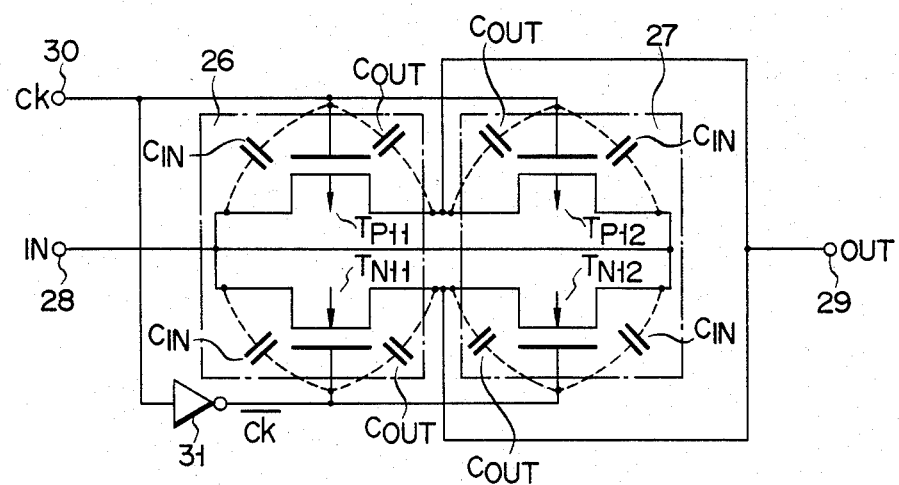
F I G. 13
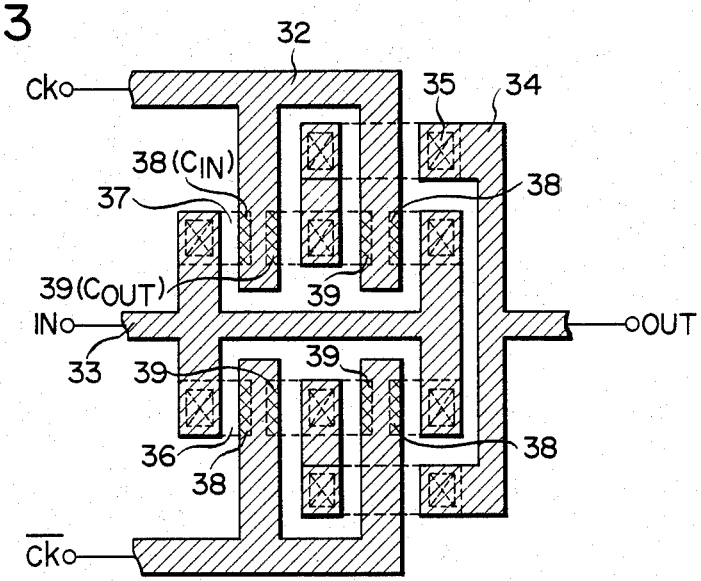

F I G. 14
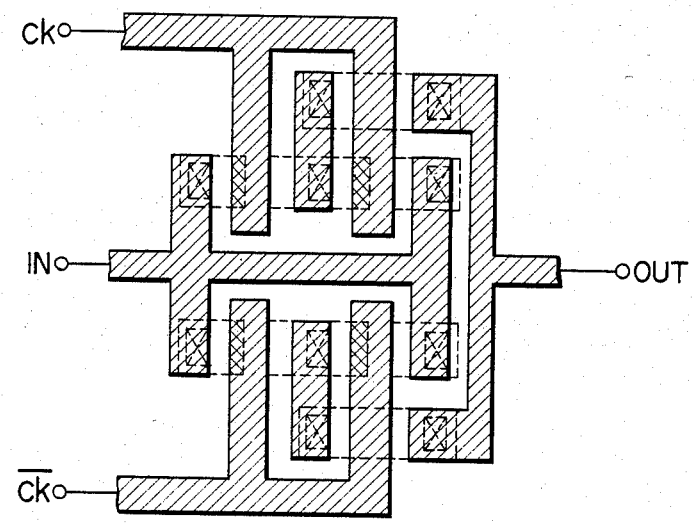
F I G. 15
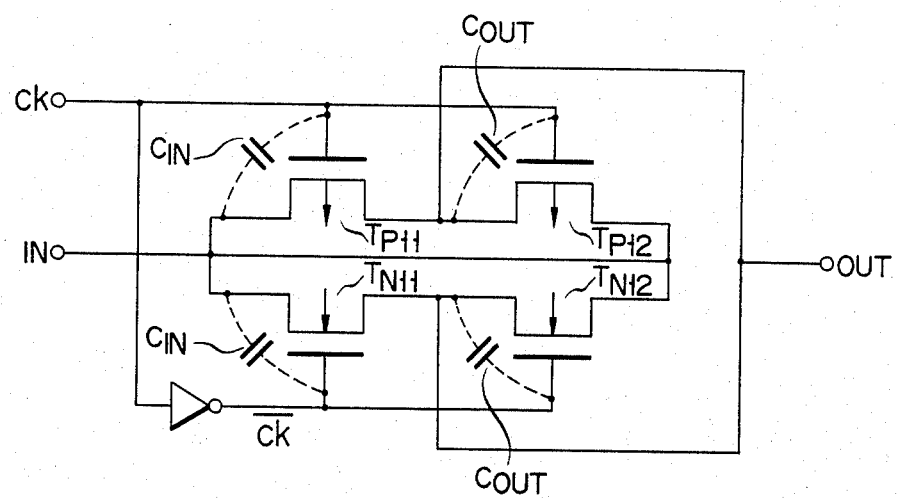

SEMICONDUCTOR ANALOG SWITCH CIRCUIT WITH COMPENSATION MEANS TO MINIMIZE OFFSET OF OUTPUT VOLTAGE

BACKGROUND OF THE INVENTION

The present invention relates to semiconductor analog switch circuits used as switch elements in a multiplexer circuit, for example.

Semiconductor analog switch circuits have been widely used as switch elements in digital circuits and analog circuits. A multiplexer circuit using the prior semiconductor analog switch circuits is illustrated in FIG. 1. In FIG. 1, reference numerals 11 and 12 designate semiconductor analog switch circuits. Inverters are denoted as 13 and 14 and a load capacitance as Co. The circuit of FIG. 1 operates in a sequence as shown in FIGS. 2A to 2C. When a switch drive signal CK1 becomes low (L), the potential of the output signal Vout is V1. When a switch drive signal CK2 becomes low, potential of the output signal Vout is V2. In this way, the semiconductor analog switch circuit under discussion operates to produce an output signal Vout, as shown in FIG. 2C.

The semiconductor analog switch circuits 11 and 12 in the multiplexer circuit shown in FIG. 1 are each made up of a P channel MOS transistor $T_P$ and an N channel MOS transistor $T_N$, which are connected in parallel. As shown in an equivalent circuit of the switch circuit, (FIG. 3) a capacitance CmP is present between the gate and the source of the transistor $T_P$ and a capacitance CmN between the gate and the drain of the same transistor. These capacitances will be called mirror capacitances.

In the semiconductor analog switch circuits 11 and 12 thus arranged, an offset voltage $\Delta V$ is produced at the output through the mirror capacitances CmP and CmN, when the clock pulse CK1 or CK2 changes from high to low level and vice versa. In a stationary level of the clock pulse CK1 or CK2, if the output voltage is Vo as shown in FIG. 4A, the output voltage is, as shown in FIG. 4B, sum of the output voltage Vo and the offset voltage $\Delta V$ at the time of the level change of the clock pulse.

The charge conservation rule theoretically describes a relationship between a charge quantity when the clock pulse CK1 or CK2 is in a stationary state or in a stable level and a charge quantity immediately after the clock pulse has changed or is in a transient state:

$$CoVo + CmVo - CmN(V_{DD} - Vo) \simeq Co(Vo + \Delta V) - \quad (1)$$

$$CmP(V_{DD} - Vo - \Delta V) + CmN(Vo + \Delta V)$$

Arranging the equation (1), we have the offset voltage $\Delta V$ $$\Delta V \simeq \frac{CmP - CmN}{Co + CmP + CmN} \times V_{DD} \quad (2)$$

Equations (1) and (2) hold on the assumption that the leak currents in the stationary state of the clock pulse and in the transient state are both negligible. Equation (1) indicates that if CmP≃CmN, the offset voltage $\Delta V$ is substantially zero, and hence the output voltage is little influenced by the offset voltage.

The fabrication of the transistors $T_P$ and $T_N$ contains many process steps such as the step for registering a mask with a semiconductor substrate and the step for diffusing impurities into the semiconductor substrate. The process of the transistor fabrication is frequently accompanied by many problems. Misalignment of the mask with the semiconductor substrate results in non-registration of patterns of the semiconductor layers. Nonuniformity of concentration of implanted impurities or a nonuniform heat treatment brings about nonuniform impurity diffusion. The expansion of a depletion layer, which occurs in the semiconductor device during its operation, is not uniform. Because of this, the above relation CmP≃CmN is frequently unsatisfied.

The mirror capacitances CmP and CmN will be described in relation to the noregistration in the patternings.

FIGS. 5 and 6 illustrate semiconductor patterns of the semiconductor analog switch circuit 11 or 12 when the patterning is exactly done. The channel length (L) of the semiconductor structure with the pattern shown in FIG. 5 is oriented in the Y direction on the X-Y coordinates, and that of the semiconductor structure of FIG. 6 is oriented in the X direction.

In FIGS. 5 and 6, reference numerals 15 and 16 respectively designate a P channel MOS transistor and an N channel MOS transistor; 17, a gate electrode; 18, a contact hole; 19, a P+ diffusion layer; and 20, and N+ diffusion layer. The areas of overlapping portions designated as 21 and 22 equivalently correspond to the mirror capacitances CmP and CmN, respectively. Input and output electrodes are designated by reference numerals 23 and 24, respectively. Since the semiconductor devices shown in FIGS. 5 and 6 are patterned exactly as intended, their equivalent circuit is expressed as shown in FIG. 3. The semiconductor devices shown in FIGS. 5 and 6 satisfy the relationship CmP≃CmN and provide no offset voltage $\Delta V$ when we consider only the patterning, but not if we consider the nonuniformity of the impurity concentration, the expansion of the depletion layer during the operation of the device, and the like.

FIGS. 7A and 8A illustrate two examples of the non-registration of the pattern shown in FIG. 5. FIG. 7A shows an example where the electrode layers 17, 23 and 24 are displaced to the (+) side in the Y direction. FIG. 8A shows another example where these layers are displaced to the (−) side in the Y direction. The structure shown in FIG. 7A has an equivalent circuit as shown in FIG. 7B. The structure of FIG. 8A has an equivalent circuit as shown in FIG. 8B. As seen from FIGS. 7B and 8B, the equivalent circuits of the semiconductor structure with the patterns shown in FIGS. 7A and 8A are different from that of FIG. 3.

In the switch device with the FIG. 7A pattern, the capacitance disappears at the input, but is doubled (2CmP) at the output, when compared with the FIG. 3 circuit. Further, the capacitance CmN disappears at the output of the switch device, but is doubled at the input to have a value of 2CmN. In the switch device with the FIG. 8A pattern, unlike the FIG. 7 switch device, the doubled capacitance 2CmP appears at the input, but the capacitance of CmP disappears at the output. The capacitance of CmN disappears at the input but the 2CmN appears at the output.

FIGS. 9A and 9B illustrate two examples of the non-registration or displacement of the patterns as shown in FIG. 6. In FIG. 9A the electrode layers 17, 23 and 24 are excessively displaced to the (+) side in the X direction. In FIG. 10A these layers 17, 23 and 24 are excessively displaced to the (−) side in the X direction. An equivalent circuit of the switch device with the FIG. 9A pattern is as shown in FIG. 9B. An equivalent circuit of the switch device with the FIG. 10A pattern is as shown in FIG. 10B.

In the case of the FIG. 9A pattern, both the capacitances CmP and CmN are not present at the input of the switch device, but 2CmP and 2CmN are present at, the output, as illustrated in the equivalent circuit of FIG. 9B. In the case of the FIG. 10A pattern, both 2CmP and 2CmN are present at the input, but none of these capacitances are present at the output, as shown in FIG. 10B.

When the pattern is not registered in the patterning, as shown in FIGS. 7A to 10A, the well balanced distribution of the mirror capacitances CmP and CmN at both the input and output, of the switch device, as shown in FIG. 3, is impaired. And in this case, these capacitances are only deviated to either the input or the output, as shown in FIGS. 7B to 10B. The result is generation of the offset voltage and variation of the output voltage. Thus, the output voltage produced is unreliable.

Another semiconductor analog switch circuit of the prior art is shown in FIG. 11. The analog switch circuit has a series circuit of P channel MOS transistors $T_{P1}$ and $T_{P2}$. A control signal CK is directly applied to the transistor $T_{P1}$. An inverted control signal $\overline{CK}$, formed by inverting the control signal CK by means of an inverter 25, is applied to the transistor $T_{P2}$. A channel width ratio of these transistors is 2:1. Even if the switch circuit is so arranged, when the nonregistration or displacement of the patterns occurs in the patterning, the distribution of the mirror capacitors is not uniform at the input and output of the switch device, as shown in FIGS. 7A to 10B. This causes the output voltage of the switch circuit to vary. Therefore, an unreliable output voltage is also produced from the switch circuit.

SUMMARY OF THE INVENTION

Accordingly, an object of the present invention is to provide a semiconductor analog switch circuit which may suppress an output voltage variation to a satisfactory value even if the mirror capacitances are not distributed uniformly, thereby ensuring a highly accurate output voltage.

According to the present invention, there is provided a semiconductor analog switch circuit device comprising a first series circuit including first and second MOS transistors, a second series circuit including third and fourth MOS transistors and connected in parallel to said first series circuit, input means for receiving an input signal connected to one of parallel junctions of said first and second series circuits, and output means for providing an output signal connected to the other parallel junction.

According to the invention there is further provided a semiconductor analog switch circuit device comprising a first series circuit including first and second MOS transistors of a first channel type controlled by a first control signal, a second series circuit including third and fourth MOS transistors, which is connected in parallel to said first series circuit and controlled by a second control signal with opposite phase to that of said first control signal, input means for receiving an input signal connected to one of parallel junctions of said first and second series circuit, and output means for providing an output signal connected to the other parallel junction.

According to the invention there is still further provided a semiconductor analog switch circuit device comprising a first series circuit including a first MOS transistor controlled by a first control signal and a second MOS transistor controlled by a second control signal with opposite phase, a second series circuit including a third MOS transistor controlled by said first control signal and a fourth MOS transistor controlled by said second control signal, said first series circuit being connected in parallel to said second series circuit, input means for receiving an input signal connected to one of parallel junctions of said first and second series circuits, and output means for providing an output signal connected to the other parallel junction.

BRIEF DESCRIPTION OF THE DRAWINGS

FIGS. 2A to 2C show a set of waveforms useful in explaining the operation of the multiplexer circuit shown in FIG. 1;

FIG. 7A illustrates the FIG. 5 structure of the analog switch circuit when the electrode layers are displaced to the (+) side in the Y direction;

FIG. 7B is an equivalent circuit of the analog switch circuit when the patterns are displaced as shown in FIG. 7A;

FIG. 8A illustrates the FIG. 5 structure of the analog switch circuit when the electrode layers are displaced to the (−) side in the Y direction;

FIG. 8B is an equivalent circuit of the analog switch circuit when the patterns are displaced as shown in FIG. 8A;

FIG. 12 is a circuit diagram of an embodiment of a semiconductor analog switch circuit according to the present invention;

FIG. 13 shows patterns in the structure of the semiconductor analog circuit shown in FIG. 12;

FIG. 14 shows the FIG. 13 structure of the analog switch circuit when the electrode layers 17, 23 and 24 are displaced to the (−) side in the X direction;

FIG. 15 is an equivalent circuit of the FIG. 14 structure of the analog switch circuit;

DETAILED DESCRIPTION OF THE PREFERRED EMBODIMENTS

Figure 1:
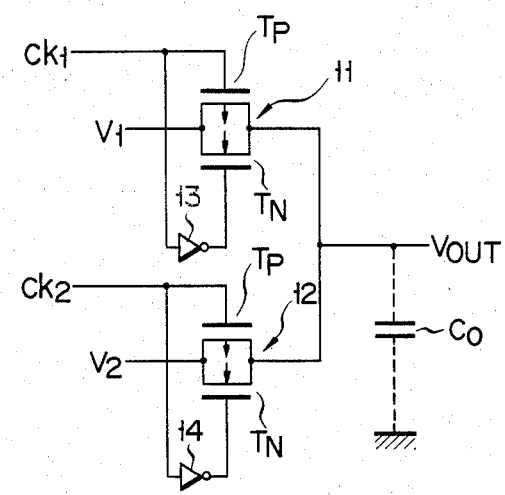
FIG. 1 is a circuit diagram of a multiplexer circuit having prior semiconductor analog switch circuits.
Figure 2C:
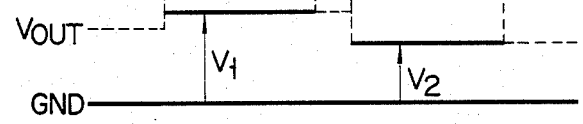

FIGS. 12 and 13 show circuit and structural diagrams of a preferred embodiment of a semiconductor analog switch circuit according to the present invention. In particular, FIG. 13 illustrates an example of patterns of the semiconductor analog switch circuit. As shown in FIG. 12, the analog switch circuit is made up of a first semiconductor analog switch circuit 26 and a second semiconductor analog switch circuit 27, which are connected to each other in parallel. An input signal IN is applied to a first junction of the first semiconductor analog switch circuit 26 with the second semiconductor analog switch circuit 27. Switch drive signals CK and $\overline{CK}$ are applied to the analog switch circuits 26 and 27 to control transistors $T_{P11}$, $T_{N11}$, $T_{P12}$ and $T_{N12}$ contained therein. Through the transistor control, an output signal is produced through a second junction of the first and second analog switch circuits 26 and 27.

To be more specific, the first semiconductor analog switch circuit 26 is made up of a P channel transistor $T_{P11}$ and an N channel transistor $T_{N11}$. The second semiconductor analog switch circuit 27 is made up of a P channel MOS transistor $T_{P12}$ and an N channel transistor $T_{N12}$. Current paths of the transistors $T_{P11}$, $T_{N11}$, $T_{P12}$ and $T_{N12}$ are connected at first ends, e.g. drains, to an input terminal 28 to which the input signal IN is applied. The second ends (e.g. sources) of the current paths of the transistors $T_{P11}$, $T_{N11}$, $T_{P12}$ and $T_{N12}$ are connected to an output terminal 29 from which an output signal OUT is derived. The gates of the transistors $T_{P11}$ and $T_{P12}$ are coupled with a control terminal 30 to which a clock pulse CK is applied. A control terminal 30 is connected via an inverter 31 to the gates of the transistors $T_{N11}$ and $T_{N12}$. Accordingly, a clock pulse $\overline{CK}$ applied to the transistors $T_{N11}$ and $T_{N12}$ has the opposite phase to that of the clock pulse CK for the transistors $T_{P11}$ and $T_{P12}$.

Mirror capacitances $C_{IN}$ are respectively formed between the gates and the first terminals of the transistors $T_{P11}$, $T_{N11}$, $T_{P12}$ and $T_{N12}$, as shown. Similarly, mirror capacitances $C_{OUT}$ are respectively formed between the gates and the second terminals of the transistors $T_{P11}$, $T_{N11}$, $T_{P12}$ and $T_{N12}$. In FIG. 13, reference numeral 32 designates a gate electrode, 33 and 34 input and output electrodes, respectively, 35 a contact hole, 36 a P+ conductivity type diffusion layer, 37 an N+ conductivity type diffusion layer. Reference numerals 38 and 39 indicate overlaying portions of the diffusion layer and the gate layer. An area designated by numeral 38 corresponds to the mirror capacitance $C_{IN}$, and an area 39 to the mirror capacitance $C_{OUT}$. The transistors $T_{P11}$, $T_{N11}$, $T_{P12}$, $T_{N12}$ are substantially equal to each other in channel width.

Figure 3:
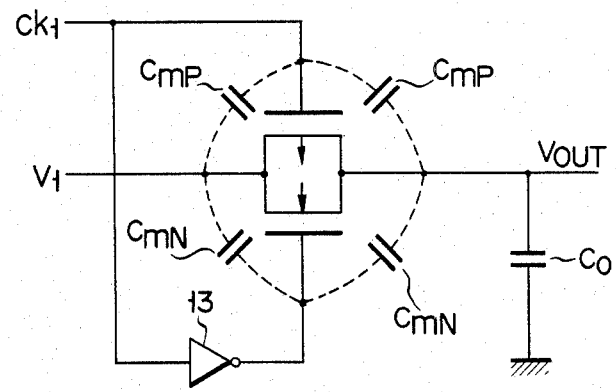
FIG. 3 is an equivalent circuit of the analog switch circuit of the multiplexer circuit of FIG. 1.
Figure 4A:
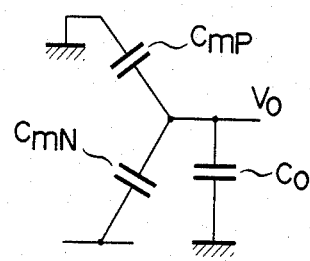
FIGS. 4A and 4B are equivalent circuits of the analog switch circuit when it is placing an emphasis on its output voltage.
Figure 4B:
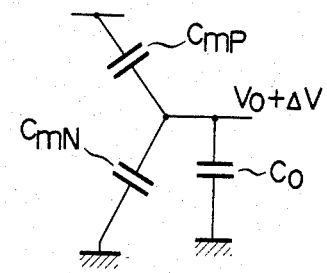
Figure 5:
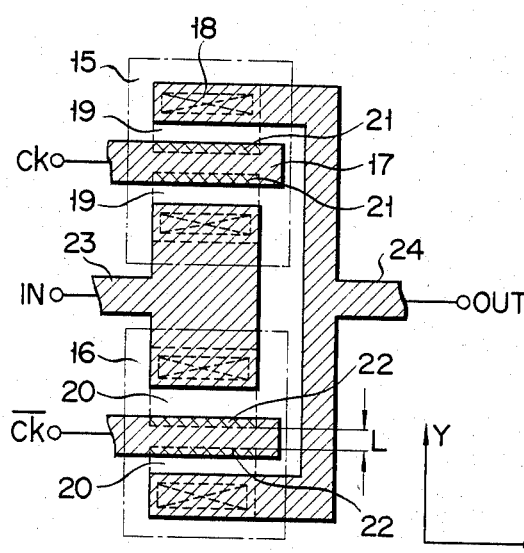
FIGS. 5 and 6 illustrate patterns in the structures of the analog switch circuit in which the patterns are exactly registered with each other.
Figure 6:
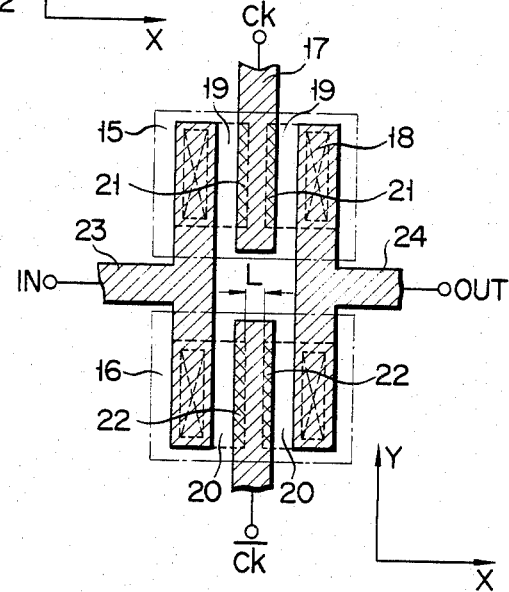
Figure 9A:
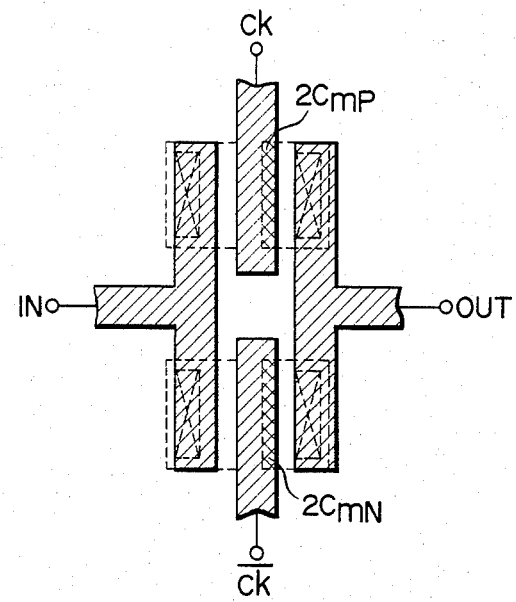
FIG. 9A shows the FIG. 6 structure of the analog switch circuit when the electrode layers are displaced to the (+) side in the X direction.
Figure 9B:
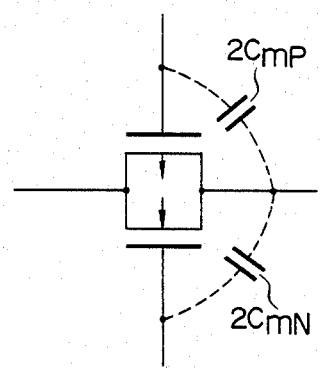
FIG. 9B is an equivalent circuit of the FIG. 9A structure of the analog switch circuit.
Figure 10A:
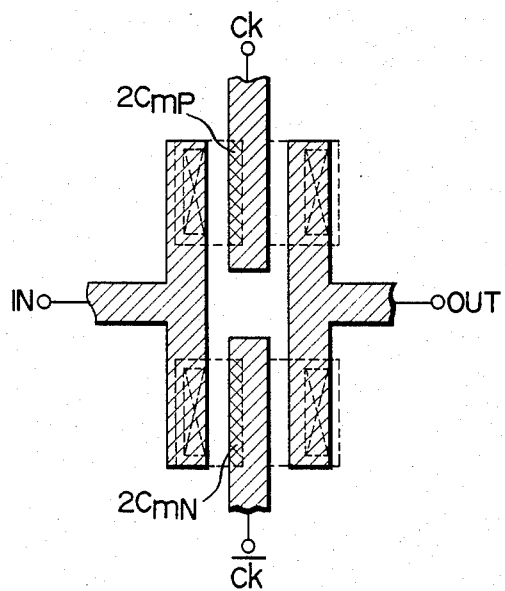
FIG. 10A shows the structure of the analog switch circuit when the electrode layers are displaced to the (−) side in the X direction.
Figure 10B:
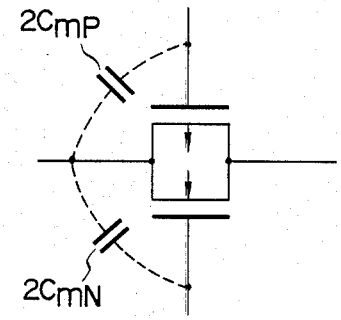
FIG. 10B is an equivalent circuit of the FIG. 10A structure of the analog switch circuit.
Figure 11:
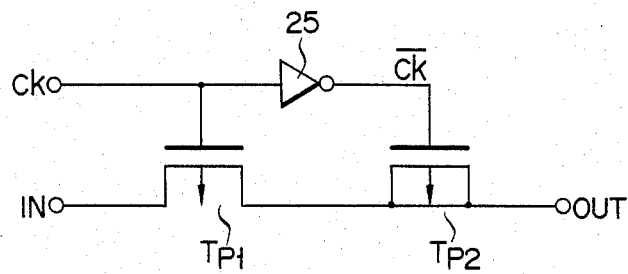
FIG. 11 is a circuit diagram of another embodiment of a prior semiconductor analog switch circuit.

In the circuit shown in FIGS. 12 and 13, if the channel width of each of the transistors $T_{P11}$, $T_{N11}$, $T_{P12}$ and $T_{N12}$ is approximately $\frac{1}{2}$ that of each of the transistors $T_P$ and $T_N$ in FIG. 3, the mirror or parasitic capacitances $C_{IN}$ and $C_{OUT}$ are ($\frac{1}{2}$)CmP and ($\frac{1}{2}$)CmN, respectively. Accordingly, the mirror capacitances at the input and output of the circuit including the transistors $T_{P11}$ and $T_{P12}$ are both CmP. The mirror capacitances at the input and output of the circuit including the transistors $T_{N11}$ and $T_{N12}$ are both CmN. Therefore, no offset voltage $\Delta V$ appears at the output of the semiconductor analog switch circuit shown in FIGS. 12 and 13.

FIG. 14 illustrates patterns in the structure of the semiconductor analog switch circuit when the electrode layers 32, 33 and 34 in the pattern shown in FIG. 3 are displaced in the (−) X direction. FIG. 15 shows an equivalent circuit of the displaced patterns.

As shown in FIG. 14, when the electrode layers 32 to 34 are displaced in the (−) X direction, the mirror capacitances at the inputs of the transistors $T_{P11}$ and $T_{N11}$ are CmP and CmN, respectively. The mirror capacitances at the outputs of the same transistors are substantially zero. The mirror capacitances at the inputs of the transistors $T_{P12}$ and $T_{N12}$ are substantially zero, while those at the outputs thereof are CmP and CmN, respectively. This indicates that the analog switch circuit shown in FIGS. 14 and 15 may be substantially described by the equivalent circuit shown in FIG. 3. Specifically, the mirror capacitances CmP and CmN are present at the inputs of the switch circuit including the first and second analog switch circuits 26 and 27. The mirror capacitances CmP and CmN are likewise present at the outputs of the same switch circuit. Since the mirror capacitances at the input and output are equal to each other, no offset voltage $\Delta V$ is produced. The present embodiment as described refers to only the displacement of the electrode layers 32 to 34 displaced in the (−) X direction. It is evident that the present invention is applicable for the displacement of the electrode layers displaced in the opposite direction, i.e., the (+) X direction.

Figure 16:
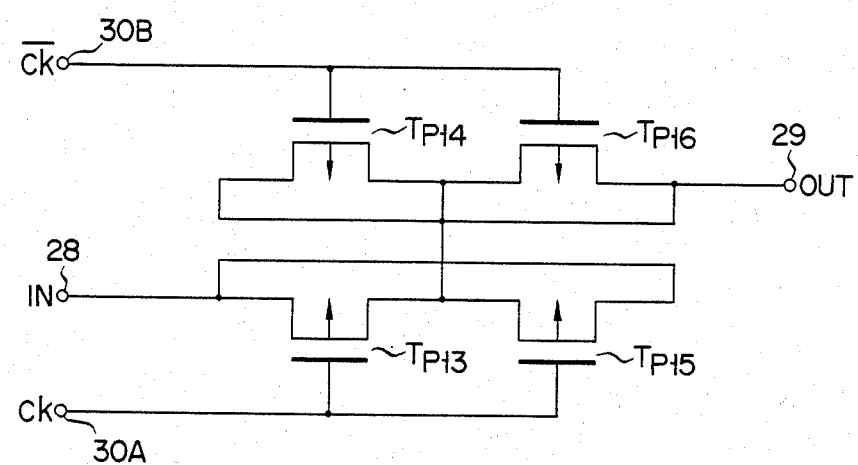
FIG. 16 is a circuit diagram of a further embodiment of a semiconductor analog switch circuit according to the present invention.

Turning now to FIG. 16, there is shown another embodiment of a semiconductor analog switch circuit according to the present invention. The analog switch circuit is comprised of a circuit including transistors $T_{P13}$ and $T_{P14}$, and another circuit including transistors $T_{P15}$ and $T_{P16}$. Both the circuits are coupled with each other in parallel.

A first terminal of a current path of the transistor $T_{P13}$ is connected to the input terminal 28 applied with an input signal IN, while a second terminal of the same is connected to a first terminal of a current path of the transistor $T_{P15}$. A second terminal of the current path of the transistor $T_{P15}$ is connected to the input terminal 28. A first terminal or electrode of a current path of the transistor $T_{P14}$ is connected to the output terminal 29 from which an output signal OUT is derived. A second electrode of the same current path is connected to a first electrode of a current path of the transistor $T_{P16}$. A second electrode of the transistor $T_{P16}$ is connected to the output terminal 29. The junctions between the transistors $T_{P13}$ and $T_{P15}$ and between the transistors $T_{P14}$ and $T_{P16}$ are interconnected with each other.

A clock pulse CK is applied via a control terminal 30A to the gates of the transistors $T_{P13}$ and $T_{P15}$. On the other hand, an inverted clock pulse $\overline{CK}$ is applied to the gates of the transistors $T_{P14}$ and $T_{P16}$, by way of a control terminal 30B. With this circuit arrangement, the input signal IN is controlled in a manner such that the transistors $T_{P13}$ and $T_{P15}$ are controlled by the clock pulse CK and the transistors $T_{P14}$ and $T_{P16}$ by the clock pulse $\overline{CK}$. In the semiconductor analog switch circuit of the present embodiment, the ratio of the channel width of the transistors $T_{P13}$ and $T_{P15}$ to that of the transistors $T_{P14}$ and $T_{P16}$ is selected to be, substantially, 2:1.

Figure 17:
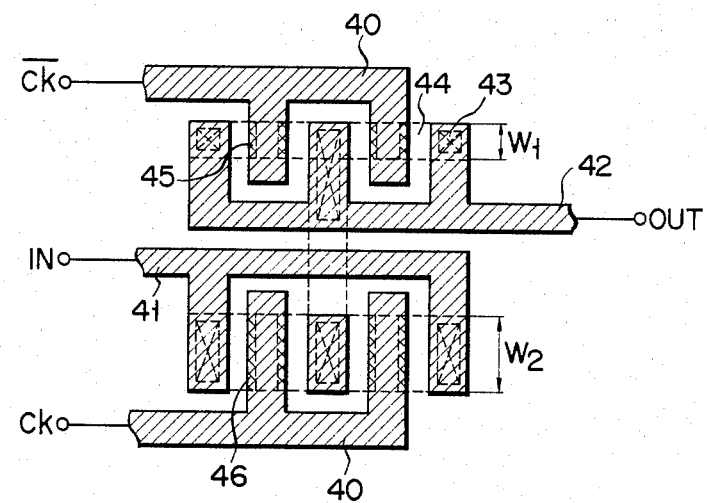
FIG. 17 illustrates patterns in the structure of the analog switch circuit shown in FIG. 16.

FIG. 17 shows a pattern in the structure of the analog switch circuit shown in FIG. 16. In FIG. 17, reference numeral 40 represents a gate electrode, 41 and 42 represent input and output electrodes, respectively, 43 a contact hole, 44 an N+ conductivity type diffusion layer. Reference numerals 45 and 46 designate overlapping portions of the diffusion layer with the gate electrode. W1 and W2 denote the channel width of the transistors $T_{P14}$ and $T_{P16}$ and that of the transistors $T_{P13}$ and $T_{P15}$ respectively. In physical dimension, $2W1=W2$.

Such a circuit arrangement prevents production of the offset voltage when the nonregistration of the patterns occurs in the patterning, as in the previous embodiments. Thus, the semiconductor analog switch circuit according to the present embodiment is operable free from the offset voltage which has inevitably been produced in the prior art.

As seen from the foregoing description, in the semiconductor analog switch circuit of the invention, the first analog switch circuit is coupled in parallel with a second analog switch circuit having the same structure. An input signal is applied to one of the junctions of the first and second analog switch circuits. An output signal is derived from the other junction. With this arrangement, if the patterns are not registered in the patterning, the offset voltage is never produced. Because of this feature, the output signal from the analog switch of the present invention is extremely exact.

It should be understood that the present invention is not limited to the embodiments as mentioned above, but may be variously modified and changed within the scope of the present invention.

What we claim is:

1. A semiconductor analog switching circuit device with a circuit for compensating an offset of an output voltage comprising:

switching means including a first MOS transistor of a first channel type and a second MOS transistor of a second channel type having their channels connected in parallel and having first and second parallel junctions;

an input terminal for receiving an input signal connected to one of said parallel junctions of said first and second transistors;

an output terminal for providing an output signal connected to the other of said parallel junctions of said first and second transistors;

first control terminal for receiving a first control signal connected to the gate of said first transistor;

second control terminal for receiving a second control signal connected to the gate of said second transistor; and compensating means for compensating an offset of said output signal including a third MOS transistor of said first channel type and a fourth MOS transistor of said second channel type having their channels connected in parallel, the compensating means and said switching means being connected in parallel, the gates of the third and fourth transistors being connected to said first and second control terminals, respectively.

2. A semiconductor analog switching circuit device according to claim 1, wherein said first through fourth MOS transistors are substantially equal in channel width.

3. A semiconductor analog switching circuit device with a circuit for compensating an offset of an output voltage comprising:

switching means including first and second MOS transistors having their channels connected in parallel and having first and second parallel junctions;

an input terminal for receiving an input signal connected to one of said parallel junctions of said first and second transistors;

an output terminal for providing an output signal;

first control terminal for receiving a first control signal connected to the gates of said first and second transistors;

second control terminal for receiving a second control signal; and compensating means for compensating an offset of said output signal including third and fourth MOS transistors having their channels connected in parallel, the third and fourth transistors having the same channel type as said first and second transistors, the parallel junctions of the third and fourth transistors being connected to each other, the compensating means being series connected between the other parallel junction of said first and second transistors and said output terminal, and the gates of the third and fourth transistors being connected to said second control terminal.

4. A semiconductor analog switching circuit device according to claim 3, wherein said first and second MOS transistors have substantially the same channel width as each other, said third and fourth MOS transistors have substantially the same channel width as each other, and said channel width of said first and second MOS transistors in substantially twice said channel width of said third and fourth MOS transistors.

* * * * *